(12) United States Patent
Chen et al.

(10) Patent No.: US 6,223,162 B1
(45) Date of Patent: Apr. 24, 2001

(54) MULTI-LEVEL RUN LENGTH CODING FOR FREQUENCY-DOMAIN AUDIO CODING

(75) Inventors: Wei-ge Chen, Issaquah; Ming-Chieh Lee, Bellevue, both of WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 09/211,277

(22) Filed: Dec. 14, 1998

(51) Int. Cl.⁷ .................................................. G10L 19/00
(52) U.S. Cl. ............................................. 704/503; 704/501
(58) Field of Search ................................. 705/500, 501, 705/502, 503, 504

(56) References Cited

U.S. PATENT DOCUMENTS

| | | |
|---|---|---|
| 4,706,265 | 11/1987 | Furukawa . |
| 4,744,085 | 5/1988 | Fukatsu . |
| 5,400,075 | 3/1995 | Savatier . |

(List continued on next page.)

FOREIGN PATENT DOCUMENTS

| | | |
|---|---|---|
| 0283735 A2 | 9/1988 | (EP) . |
| 0612156 A2 | 4/1989 | (EP) . |
| 0535571 A2 | 4/1993 | (EP) . |
| 0540350 A2 | 5/1993 | (EP) . |
| 0830029 A2 | 3/1998 | (EP) . |
| 62-247626 | 10/1987 | (JP) . |
| 09232968 | 9/1997 | (JP) . |
| WO 98/40969 | 9/1998 | (WO) . |

OTHER PUBLICATIONS

Tewfik et al., "Enhanced Wavelet Based Audio Coder," Proc. ASILOMAR Conference, IEEE (1993).

ISO/IEC 13818–7: Information Technology—Generic coding of moving pictures and associated audio information—Part 7: Advanced Audio Coding, pp. I–iv, 1–147 (1997).

ISO/IEC 13818–7: Information Technology—Generic coding of moving pictures and associated audio information—Part 7: Advanced Audio Coding, Technical Corrigendum 1, pp. 1–22 (Dec. 1998).

Fogg, "Survey of Software and Hardware VLC Architectures," SPIE vol. 2186, pp. 29–37 (no date of publication).

Gibson et al., *Digital Compression of Multimedia*, "Lossless Source Coding," Chapter 2, pp. 17–62 (1998).

Gibson et al., *Digital Compression of Multimedia*, "Universal Lossless Source Coding," Chapter 3, pp. 63–112 (1998).

Gibson et al., *Digital Compression of Multimedia*, "MPEG Audio," Chapter 11.4, pp. 398–402 (1998).

Gibson et al., *Digital Compression of Multimedia*, "Advanced Audio Coding," Chapter 11.6.2, pp. 415–416 (1998).

Gibson et al., *Digital Compression of Multimedia*, "Frequency Domain Coding," Chapter 7, pp. 227–262 (1998).

Gibson et al., *Digital Compression of Multimedia*, "Frequency Domain Speech and Audio Coding Standards," Chapter 8, pp. 263–290 (1998).

(List continued on next page.)

Primary Examiner—David R. Hudspeth
Assistant Examiner—Abul K. Azad
(74) Attorney, Agent, or Firm—Klarquist Sparkman Campbell Leigh & Whinston, LLP

(57) ABSTRACT

A technique for entropy coding information relating to frequency domain audio coefficients. For portions of a frequency spectrum having a predominate value of zero, a multi-level run length encoder statistically correlates sequences of zero values with non-zero values and assigns variable length code words. An encoder uses a specialized code book generated with respect to the probability of receiving an input sequence of zero-valued spectral coefficients followed by a non-zero coefficient. A corresponding decoder associates a variable length code word with a sequence of zero value coefficients adjacent a non-zero value coefficient.

21 Claims, 7 Drawing Sheets

U.S. PATENT DOCUMENTS

| | | |
|---|---|---|
| 5,550,541 | 8/1996 | Todd . |
| 5,552,832 | 9/1996 | Astle . |
| 5,579,430 * | 11/1996 | Grill et al. .............................. 704/203 |
| 5,644,305 | 7/1997 | Inoue et al. . |
| 5,819,215 * | 10/1998 | Dobson et al. ....................... 704/230 |
| 5,825,830 | 10/1998 | Kopf . |
| 5,831,559 | 11/1998 | Agarwal et al. . |
| 5,883,589 | 3/1999 | Takashima et al. . |
| 5,884,269 | 3/1999 | Cellier et al. . |
| 5,946,043 | 8/1999 | Lee et al. . |
| 5,959,560 | 9/1999 | Said et al. . |
| 6,029,126 * | 2/2000 | Malvar ................................. 704/204 |

OTHER PUBLICATIONS

International Organization for Standardisation ISO/IEC JTCI/SC29/WG11,N2459 "Overview of the MPEG–4 Standard," (Oct. 1998).

Video Coding For Low Bitrate Communication, "Line Transmission of Non–Telephone Signals," Telecommunication Standardization Sector of International Telecommunication Union, Dec. 5, 1995, pp.22–23.

Allen Gersho and Robert M. Gray, *Vector Quantization and Signal Compression*, "Entropy Coding," 1992, Chap. 9, pp. 259–305.

"Information Technology—Very Low Bitrate Audio–Visual Coding," Part 3: Audio, ISO/JTC1/SC29, N2203, May 15, 1998, pp. 4–9, including section on Huffman Coding.

International Organisation for Standardisation Organisation Internationale De Normalisation, ISO/IEC JTC1/SC29/WG11, N2202, Coding of Moving Pictures and Audio, Tokyo, Mar. 1998.

Stanley N. Baron, Mark I. Krivocheev, "Coding the Audio Signal," *Digital Image and Audio Communications*, 1996, pp. 101–128.

* cited by examiner

MULTI-LEVEL RUN LENGTH CODING FOR FREQUENCY-DOMAIN AUDIO CODING

FIELD OF THE INVENTION

The present invention relates to setting one or more thresholds to divide an input signal into multiple regions, and applying entropy encoding to encode a variable length first region with a variable length entropy code, and applying a second coding method to a second region.

BACKGROUND

In a typical audio coding environment, data is represented as a long sequence of symbols which is input to an encoder. The input data is encoded by an encoder, transmitted over a communication channel (or simply stored), and decoded by a decoder. During encoding, the input is pre-processed, sampled, converted, compressed or otherwise manipulated into a form for transmission or storage. After transmission or storage, the decoder attempts to reconstruct the original input.

Audio coding techniques can be generally categorized into two classes, namely the time-domain techniques and frequency-domain ones. Time-domain techniques, e.g., ADPCM, LPC, operate directly in the time domain while the frequency-domain techniques transform the audio signals into the frequency domain where compression is performed. Frequency-domain codecs (compressors/decompressors) can be further separated into either subband or transform coders, although the distinction between the two is not always clear. That is, sub-band coders typically use band-pass filters to divide an input signal into a small number (e.g., four) of sub-bands, whereas transform coders typically have many sub-bands (and therefore a correspondingly large number of transform coefficients). Processing an audio signal in the frequency domain is motivated by both classical signal processing theories and human perception psycho-aoustics model.

Psychoacoustics take advantage of known properties of the listener in order to reduce information content. For example, the inner ear, specifically the basilar membrane, behaves like a spectral analyzer and transforms the audio signal into spectral data before further neural processing proceeds. Frequency-domain audio codecs often take advantage of auditory masking that is occurring in the human hearing system by modifying an original signal to eliminate information redundancies. Since human ears are incapable of perceiving these modifications, one can achieve efficient compression without distortion.

Masking analysis is usually conducted in conjunction with quantization so that quantization noise can be conveniently "masked." In modern audio coding techniques, the quantized spectral data are usually further compressed by applying entropy coding, e.g., Huffman coding. Compression is required because communication channels usually have limited available capacity or bandwidth. It is frequently necessary to reduce the information content of input data in order to allow it to be reliably transmitted, if at all, over the communication channel.

Tremendous effort has been invested in developing lossless and lossy compression techniques for reducing the size of data to transmit or store. One popular lossless technique is Huffman encoding, which is a particular form of entropy encoding. Entropy coding assigns code words to different input sequences, and stores all input sequences in a code book. The complexity of entropy encoding depends on the number m of possible values an input sequence X may take.

For small m, there are few possible input combinations, and therefore the code book for the messages can be very small (e.g., only a few bits are needed to unambiguously represent all possible input sequences). For digital applications, the code alphabet is most likely a series of binary digits $\{0, 1\}$, and code word lengths are measured in bits.

If it is known that input is composed of symbols having equal probability of occurring, an optimal encoding is to use equal length code words. But, it is not typical that an input stream has equal probability of receiving any particular message. In practice, certain messages are more likely than others, and entropy encoders take advantage of such data correlation to minimize the average length of code words among expected inputs. Traditionally, however, fixed length input sequences are assigned variable length codes (or conversely, variable length sequences are assigned fixed length codes).

By their nature, however, most compression techniques for audiovisual data are lossy processes. The level of quality and fidelity delivered in sound and video files depends primarily on how much bandwidth is available and whether the compressor/de-compressor (codec) is optimized to prepare output for an available bandwidth.

SUMMARY

The invention relates to a method for entropy coding information relating to frequency domain audio coefficients. In particular, the invention relates to a form of multi-level encoding audio spectral frequency coefficients. Illustrated embodiments are particularly adapted to coding environments in which multiple encoding methods can be chosen based on statistical profiles for frequency coefficient ranges. Encoding methods can be optimized for portions of a frequency spectrum, such as portions having a predominate value.

In illustrated embodiments, the predominate value in certain frequency ranges are zero value frequency coefficients, and they are encoded with the multi-level run-length encoder (RLE) encoder. The multi-level encoder statistically correlates sequences of zero values with one or more non-zero symbols and assigns variable length code words to arbitrarily long input sequences of such zero and non-zero values. The RLE based entropy encoder uses a specialized code book generated with respect to the probability of receiving an input sequence of zero-valued spectral coefficients followed by a non-zero spectral coefficient. If code book size is an issue, the probabilities can be sorted and less probable input sequences excluded from the code book.

Similarly, the range containing mostly non-zero values is encoded with a variable-to-variable entropy encoder, where a variable length code word is assigned to arbitrarily long input sequences of quantization symbols. An overall more efficient process is achieved by basing coding methods according to the properties of the input data. In practice, the number of partitions and frequency ranges will vary according to the type of data to be encoded and decoded.

DETAILED DESCRIPTION

Exemplary Operating Environment

Figure 1:
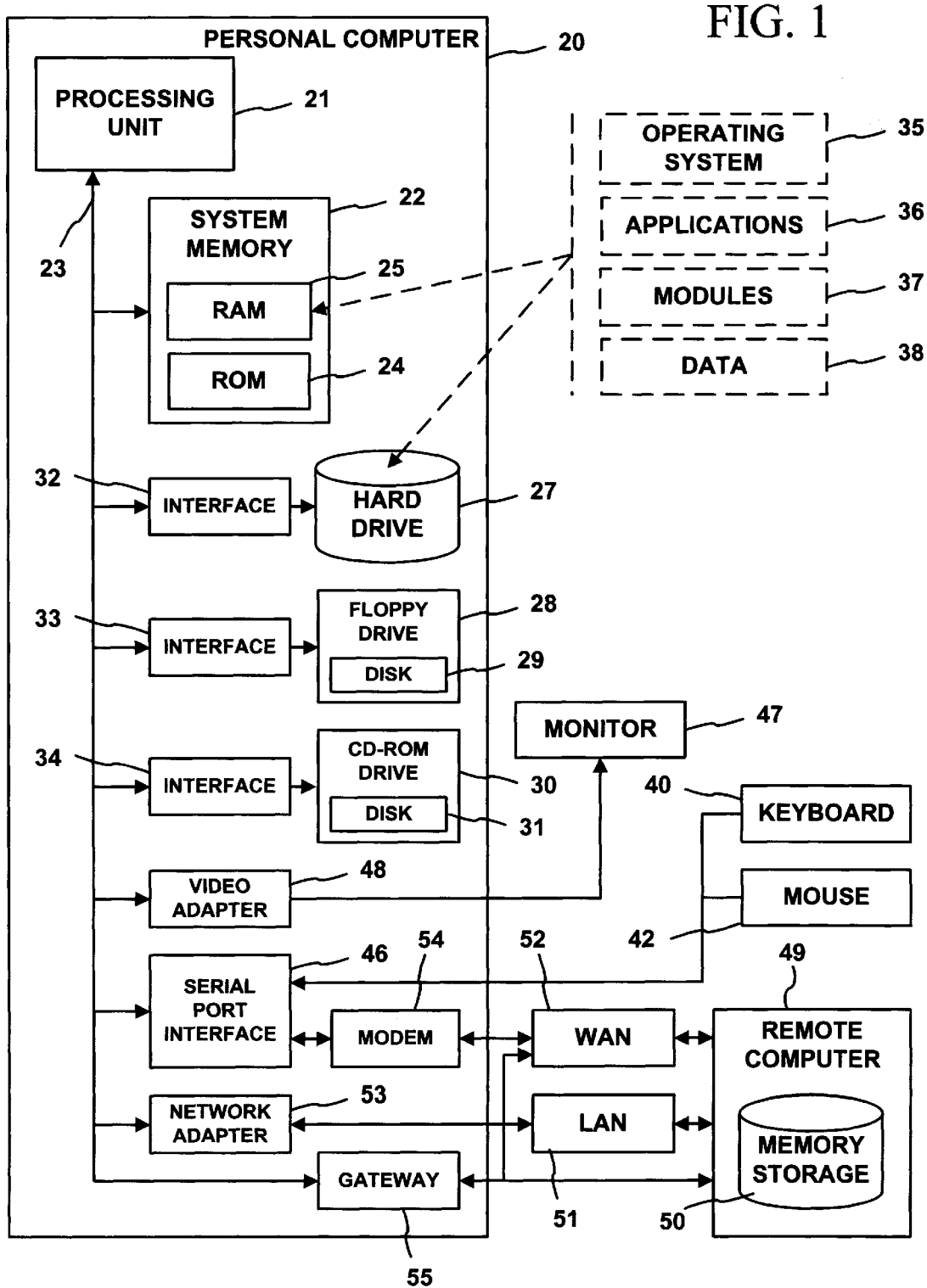
FIG. 1 is a block diagram of a computer system that may be used to implement run-length coding for frequency domain audio coding.

FIG. 1 and the following discussion are intended to provide a brief, general description of a suitable computing environment in which the invention may be implemented. While the invention will be described in the general context of computer-executable instructions of a computer program that runs on a personal computer, those skilled in the art will recognize that the invention also may be implemented in combination with other program modules. Generally, program modules include routines, programs, components, data structures, etc. that perform particular tasks or implement particular abstract data types. Moreover, those skilled in the art will appreciate that the invention may be practiced with other computer system configurations, including hand-held devices, multiprocessor systems, microprocessor-based or programmable consumer electronics, minicomputers, mainframe computers, and the like. The illustrated embodiment of the invention also is practiced in distributed computing environments where tasks are performed by remote processing devices that are linked through a communications network. But, some embodiments of the invention can be practiced on stand alone computers. In a distributed computing environment, program modules may be located in both local and remote memory storage devices.

With reference to FIG. 1, an exemplary system for implementing the invention includes a computer 20, including a processing unit 21, a system memory 22, and a system bus 23 that couples various system components including the system memory to the processing unit 21. The processing unit may be any of various commercially available processors, including Intel x86, Pentium and compatible microprocessors from Intel and others, the Alpha processor by Digital, and the PowerPC from IBM and Motorola. Dual microprocessors and other multi-processor architectures also an be used as the processing unit 21.

The system bus may be any of several types of bus structure including a memory bus or memory controller, a peripheral bus, and a local bus using any of a variety of conventional bus architectures such as PCI, AGP, VESA, Microchannel, ISA and EISA, to name a few. The system memory includes read only memory (ROM) 24 and random access memory (RAM) 25. A basic input/output system (BIOS), containing the basic routines that help to transfer information between elements within the computer 20, such as during start-up, is stored in ROM 24.

The computer 20 further includes a hard disk drive 27, a magnetic disk drive 28, e.g., to read from or write to a removable disk 29, and an optical disk drive 30, e.g., for reading a CD-ROM disk 31 or to read from or write to other optical media. The hard disk drive 27, magnetic disk drive 28, and optical disk drive 30 are connected to the system bus 23 by a hard disk drive interface 32, a magnetic disk drive interface 33, and an optical drive interface 34, respectively. The drives and their associated computer-readable media provide nonvolatile storage of data, data structures, computer-executable instructions, etc. for the computer 20. Although the description of computer-readable media above refers to a hard disk, a removable magnetic disk and a CD, it should be appreciated by those skilled in the art that other types of media which are readable by a computer, such as magnetic cassettes, flash memory cards, digital video disks, Bernoulli cartridges, and the like, may also be used in the exemplary operating environment.

A number of program modules may be stored in the drives and RAM 25, including an operating system 35, one or more application programs (e.g., Internet browser software) 36, other program modules 37, and program data 38.

A user may enter commands and information into the computer 20 through a keyboard 40 and pointing device, such as a mouse 42. Other input devices (not shown) may include a microphone, joystick, game pad, satellite dish, scanner, or the like. These and other input devices are often connected to the processing unit 21 through a serial port interface 46 that is coupled to the system bus, but may be connected by other interfaces, such as a parallel port, game port or a universal serial bus (USB). A monitor 47 or other type of display device is also connected to the system bus 23 via an interface, such as a video adapter 48. In addition to the monitor, personal computers typically include other peripheral output devices (not shown), such as speakers and printers.

The computer 20 is expected to operate in a networked environment using logical connections to one or more remote computers, such as a remote computer 49. The remote computer 49 may be a web server, a router, a peer device or other common network node, and typically includes many or all of the elements described relative to the computer 20, although only a memory storage device 50 has been illustrated in FIG. 1. The computer 20 can contact the remote computer 49 over an Internet connection established through a Gateway 55 (e.g., a router, dedicated-line, or other network link), a modem 54 link, or by an intra-office local area network (LAN) 51 or wide area network (WAN) 52. It will be appreciated that the network connections shown are exemplary and other means of establishing a communications link between the computers may be used.

In accordance with the practices of persons skilled in the art of computer programming, the present invention is described below with reference to acts and symbolic representations of operations that are performed by the computer 20, unless indicated otherwise. Such acts and operations are sometimes referred to as being computer-executed. It will be appreciated that the acts and symbolically represented operations include the manipulation by the processing unit 21 of electrical signals representing data bits which causes a resulting transformation or reduction of the electrical signal representation, and the maintenance of data bits at memory locations in the memory system (including the system memory 22, hard drive 27, floppy disks 29, and CD-ROM 31) to thereby reconfigure or otherwise alter the computer system's operation, as well as other processing of signals. The memory locations where data bits are maintained are physical locations that have particular electrical, magnetic, or optical properties corresponding to the data bits.

Figure 2:
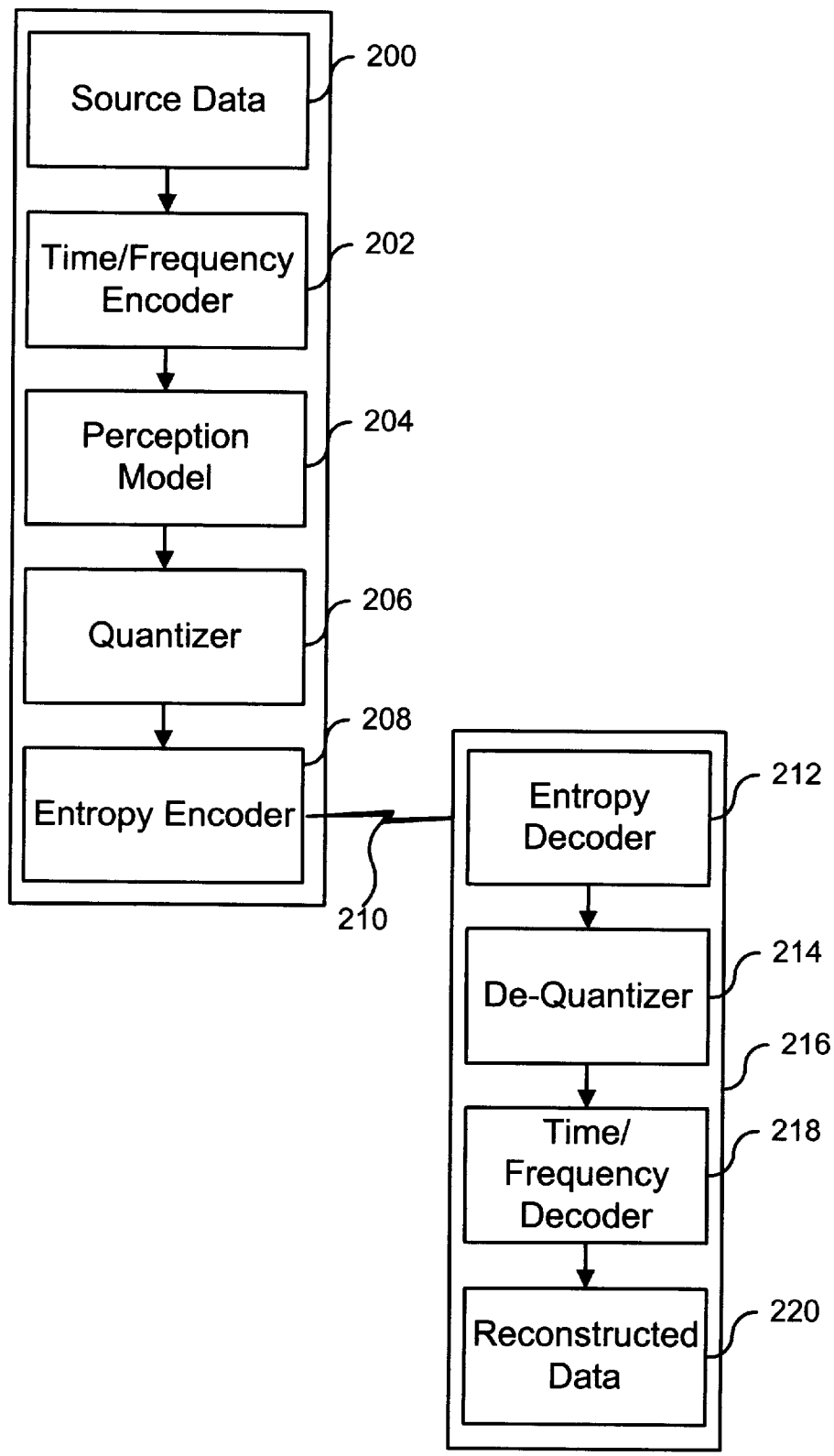
FIG. 2 is a flow chart showing encoding and decoding audio data in a frequency domain audio coder.

FIG. 2 shows a transmission model for transmitting audio data over a channel 210. The source of the transmission may be a live broadcast, stored data, or information retrieved over wired/wireless communication link (e.g., a LAN or the Internet). It is presumed that the channel 210 is of limited bandwidth, and therefore compression of source data 200 is desirable before data can be reliably sent over the channel. Note that although this discussion focuses on transmission of audio data, the invention applies to transfer of other data, such as audio visual information having embedded audio data (e.g., multiplexed within an MPEG data stream), or other data sources having compressible data patterns (e.g., coherent data).

As illustrated, source data 200 is input to a time/frequency transform encoder 202 such as a filter bank or discrete-cosine type transform. Transform encoder 202 is designed so as to convert a continuous or sampled time-domain input, such as an audio data source, into multiple frequency bands of predetermined (although perhaps differing) bandwidth. These bands can then be analyzed with respect to a human auditory perception model 204 (for example, a psychoacoustic model) in order to determine components of the signal that may be safely reduced without audible impact. For example, it is well known that certain frequencies are inaudible when certain other sounds or frequencies are present in the input signal (simultaneous masking). Consequently, such inaudible signals can be safely removed from the input signal. Use of human auditory models is well known, e.g., the MPEG 1, 2 and 4 standards. (Note that such models may be combined into a quantization 206 operation.)

After performing the time/frequency transformation 202, frequency coefficients within each range are quantized 206 to convert each coefficient (amplitude levels) to a value taken from a finite set of possible values, where each value has a size based on the bits allocated to representing the frequency range. The quantizer may be a conventional uniform or non-uniform quantizer, such as a midriser or midtreader quantizer with (or without) memory. The general quantization goal is identifying an optimum bit allocation for representing the input signal data, i.e., to distribute usage of available encoding bits to ensure encoding the (acoustically) significant portions of the source data. Various quantization methods, such as quantization step size prediction to meet a desired bit rate (assuming constant bit rate) can be used. After the source 200 has been quantized, the resultant data is then entropy encoded 208.

The entropy encoded output is transmitted over the communication channel 210 (or stored for later transmission). The receiving end 216 then implements a reverse-encoding process, i.e., a series of steps to undo the encoding of the source data 200. That is, encoded data is received over the channel 210 as input to an entropy decoder 212 which performs a reverse code book look-up to convert the encoded output into an approximation of the original quantization output for the input symbol series 200. This approximate data is then processed by a de-quantizer 214 and a time/frequency transform decoder 218 to reverse the original coding operations, resulting in a reconstructed data 220 that is similar to the original source data 200. It should be noted that the reconstructed data 220 only approximates the original source data 200 since applying steps 204–208 is a lossy process.

One possible implementation for this transmission model is a client application program wanting to process, display or play real-time data as it is retrieved over a network link from a server/serving application. For example, the client can use a streaming delivery system that provides adaptive bandwidth reservation. (One such streaming format is the Microsoft Advanced Streaming Format.) A streaming environment contrasts traditional networking programs by allowing data delivery to be optimized for particular retrieval needs, such as line speed constraints. A distinguishing feature of streaming data is that data can be viewed progressively in real time as a client receives it. Note that it is intended that processed data can be stored for later retrieval by a client, and that such retrieval can be performed in a non-streaming format (e.g., by a small playback appliance).

The streaming format defines the structure of synchronized object data streams, and allows any object, e.g., audio and video data objects, scripts, ActiveX controls, and HTML documents, to be placed into a data stream. An Application Programming Interface (one such API is the Microsoft Audio Compression Manager) is provided to facilitate application support for the streaming format. Transmission of streaming format data over the communication channel 210 requires that the source information be converted into a form suitable for the network. But, unlike traditional packets which contain routing information and data, streaming packets contain a prioritized mix of data from different objects within the stream, so that the bandwidth can be first allocated to higher priority objects. On the receiving end 216, the objects within the prioritized data stream are reconstructed for use by the receiver.

Because data is probably being used as it is received, streaming content is susceptible to transmission delays. If data does not arrive reliably, or if transmission speed falls below an acceptable minimum, the data might become unusable (e.g., playback of a video sequence may fail). Consequently, bandwidth intensive data (such as audio feeds) needs significant compression to ensure its bandwidth requirements can be met by the communication channel 210. As the degree of lossy compression necessarily impacts the quality of the reproduced signal, a server should provide selectable encodings for different client network connection speeds (or use an adaptive feedback system to discern real-time throughput).

A particularly effective method for encoding the frequency coefficients source data 200 to ensure reliable transmission over the communication channel 210 is entropy encoding. As discussed below, one can capitalize on the data coherency by applying different encoding methods optimized for different parts of the input data. Entropy encoding is effective when symbols have non-uniform probability distribution. Entropy coding methods that group many input symbols, such as the variable-to-variable and RLE coders discussed below, are good at capitalizing on data coherency. Using different encoding methods for different frequency ranges allows for more-optimal encoding when the encoders are tailored to probability distributions for each such range.

A particularly effective entropy encoding method for mostly non-zero data one that assigns variable length codes to variable length input (a variable-to-variable encoder), as disclosed in a contemporaneously filed application entitled "Entropy Code Mode Switching for Frequency-domain Audio Coding," bearing Ser. No. 09/211,531; this application is incorporated herein by reference.

Figure 3:
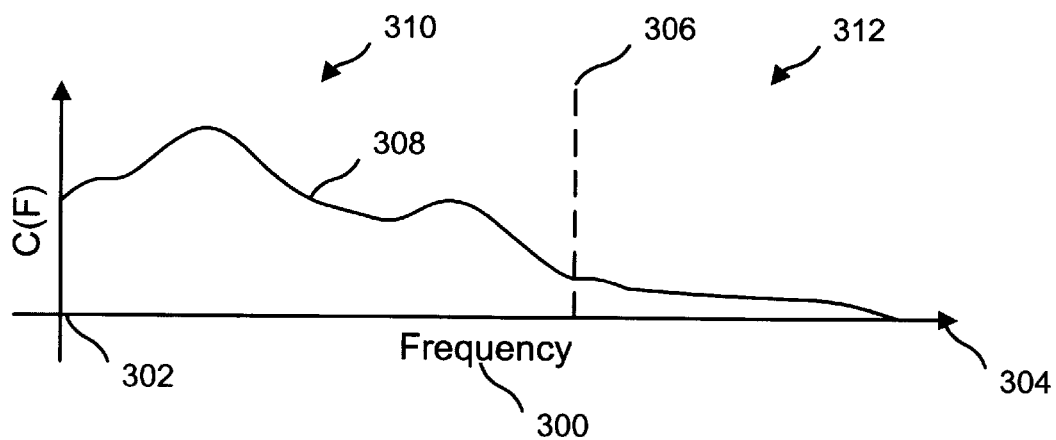
FIG. 3 illustrates a frequency range divided according to statistical properties for audio data frequency coefficients.

FIG. 3 illustrates a time domain signal that has been converted to the frequency domain. Along the X axis is a range 300 of frequencies from zero 302 through a maximum frequency 304. A partition 306 has been defined within the range 300, where the partition is determined according to statistical analysis of an expected input stream (e.g., statistical information obtained while training an entropy code book, or by adaptive analysis of the actual input), and this statistical model is applied against actual input 308 for encoding.

One approach to setting a partition is, as discussed above, is placing a certain percentage of frequencies or critical bands below the boundary.

An alternate method is to collect basic statistics, such as the probability of zeros and non-zeros according to the probability distributions for each frequency. Inspection of each frequency's statistics shows a gradual change across frequencies, and a partition boundary can be selected so that distributions within each partition are similar. Note that the frequency partition is sensitive to the sampling rate of the input and the expected bit rate. The sampling rate and the bit rate determine the stochastic property of the quantized frequency coefficients, and this property is basically responsible for determining partition placement.

A more optimal method is to adaptively locate a partition by performing an exhaustive search to determine an "optimal" boundary location. That is, an optimal solution is to try every frequency (or subset thereof) as a partition location, perform entropy coding, and track which boundary potential position yielded a minimum number of bits for encoding. Although computationally more intensive, if computation costs are at issue, the compression benefits of an exhaustive search (or near exhaustive if frequency subsets are used) can outweigh costs when multiple partitions are used.

By separating out the frequency spectrum 300 into separate frequency sub-ranges 310, 312, an encoder can apply different encoding schemes that have been optimized to encode the different frequency ranges. This contrasts previous methods, such as entropy encoding schemes that substituted different entropy coding tables according to characteristics of data to be encoded. Such prior methods are limited by the flexibility of their single entropy encoding algorithm, by the inability of an encoding table to account for different kinds of input data, and by the overhead associated with identifying when different tables should be used. A method optimized for one type of data can not be efficiently applied to a different type of data.

In the illustrated embodiment, the selected dividing criteria for the range 300 is the probability C(F) (Y-axis) that a particular spectral event is a run of coefficients at or near a particular intensity (e.g., zero). As with code book generation, the probability of receiving zero value data can be pre-computed with respect to exemplary input. As illustrated, the input signal 308 has high probability of being zero after the indicated partition 306. The position of the partition divider 306 is chosen so that a certain amount of the input beyond the divider, such as 80%, is at or near (and thus equated to) a predetermined value. (In illustrated embodiments, the predetermined value is zero.)

It is assumed that, at a minimum, an input signal 308 is divided into two ranges, each range having data characteristics best-suited to compression by different encoding methods. In the illustrated embodiment, one range has primarily zero values, while the other has primarily non-zero values. Thus, two encoders are used, each optimized for the type of data within its corresponding range. While the illustrated implementation partitions the frequency coefficients into two ranges, more than two ranges can be defined, each having its own optimized encoder, or different ranges can share similar characteristics and thus utilize the same encoder.

Figure 5:
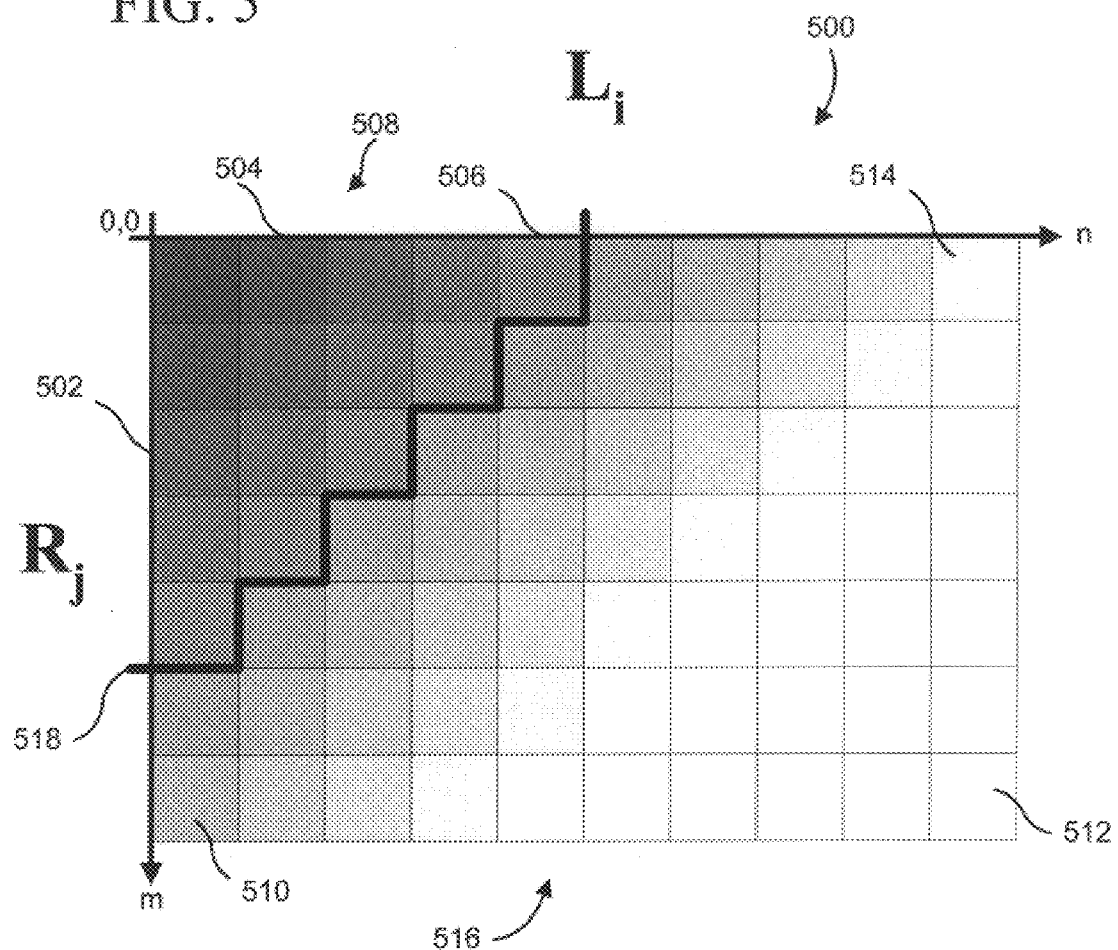
FIG. 5 illustrates a threshold grid used in encoding audio sequences having repeating spectral coefficients.

For encoding the mostly non-zero range 310, the variable-to-variable encoder incorporated herein above may be used. For the mostly zero-value range 312, an encoder optimized for such data is used. In the illustrated embodiment, a run length encoder (RLE) is used as it is optimized for encoding data that has a predominate value (e.g., zero). FIG. 5 illustrates one RLE-based entropy encoder that can efficiently encode the mostly zero valued range 312.

Figure 4:
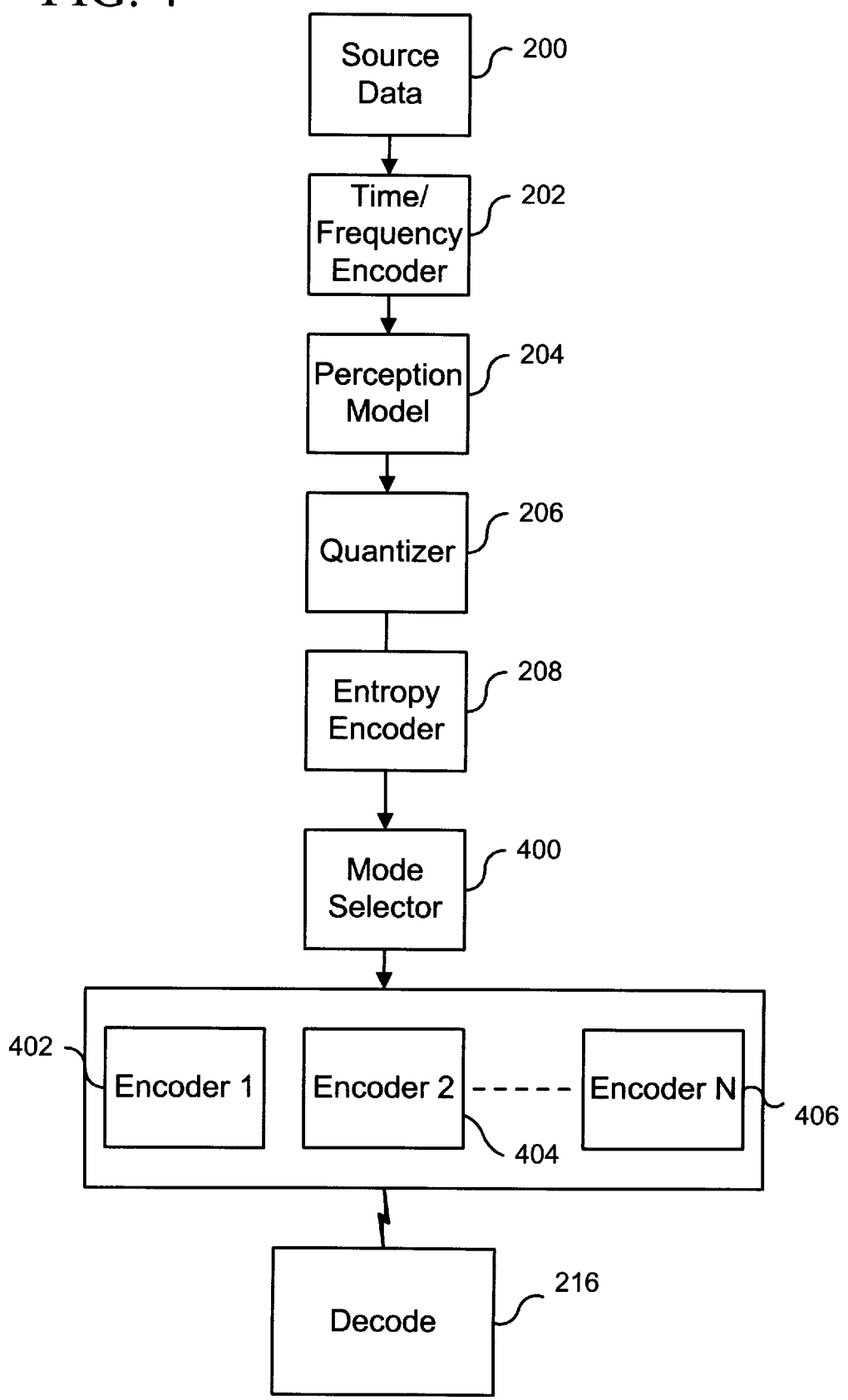
FIG. 4 illustrates an that employs entropy coding mode switching.

FIG. 4 illustrates a transmission model for transmitting audio data over a channel (see FIG. 2), in which multiple entropy encoding/decoding methods are used to manipulate input data 200. It is known that the source audio data 200 will have values within some frequency range. As discussed above for FIG. 2, source data 200 may be converted 202 into the frequency domain, reduced according to perception models 204, and quantized 206. Since quantization may produce significant numbers of near zero output values, an entropy encoder 208 can be optimized to encode this quantization output.

After quantization, the spectral coefficients for the quantized data tend to track the information content of typical audio data. Analysis of the quantization coefficients shows they are most likely non-zero at lower frequency ranges, and mostly zero coefficients at higher frequencies.

Therefore, for frequency partitions located at certain frequency positions, a mode selector 400 can determines which encoder to according to the frequency range being encoded.

Determining placement of the partition can be based on a statistical analysis identifying which of several known entropy encoders will achieve better coding efficiency for different sub-ranges. In one configuration, analysis is performed in advance of encoding or decoding with respect to exemplary input. This allows for pre-determination of partition locations, and corresponding encoders for each sub-range, so that no overhead needs to be introduced to flag changes in applicable coders.

Alternatively, statistical analysis may be performed on current data (in real time or off-line). In this configuration, although the encoders/decoders are known in advance, a flag needs to be embedded into the encoded data stream to indicate changes in applicable coders. As discussed above, different potential partition locations can be tried until a certain degree of coding efficiency is achieved for each sub-range. Receipt by a decoder of the flag indicates the end of a sub-range, and the value of the flag indicates which decoder to use for successive data.

Although inserting markers adds some overhead to the encoding/decoding process, such markers represent an improvement over prior-art encoding methods. For example, compare illustrated embodiments with traditional (see, e.g., MPEG 1, 2, and 4) entropy encoding of audio data. A traditional system uses a single entropy encoder for all data, where different code books are associated with each of many critical bands in the input data's frequency range (usually 24 or more bands, depending on the sampling rate). At each critical band transition, assuming 24 bands, a 2 bit (or longer) flag is required to indicate which of 24 code books are to be used to encode the band's data. (5 bits are required to track 24 states, but this flag can itself be encoded into effectively fewer bits.) This sharply contrasts the illustrated embodiments which either require no flag at all, or which uses flags, but is more efficient over prior methods unless the number of sub-ranges becomes comparable to the number of critical bands, and the number of encoding methods approaches the number of tables. That is, in every encoding using critical bands, there will be 24 sub-ranges requiring a 2–5 bit flag to indicate which encoding table to use. In contrast, illustrated embodiments may only have 2 or three sub-ranges, thus much less overhead.

As shown, there are N pre-defined encoders 402–406, each optimized to encode a frequency range having data with some predominate characteristic. This does not mean that there are necessarily N distinct input ranges, as different frequency ranges may have similar statistical characteristics for its data, and hence use the same encoder. In the illustrated example, there are only two ranges (one partition), corresponding to low (mostly non-zero coefficients) and high (mostly zero coefficients) frequency ranges. Hence, the mostly zero data past the partition is encoded with an RLE type encoder (see, e.g., FIG. 5), and the data before the partition is encoded with a variable-to-variable entropy-type entropy encoder.

In the general case, however, once statistical information is available for a particular input, different encoders may be selected according to whichever encoder is best able to compress an input. For example, encoding methods, such as traditional Huffman encoding, vector Huffman variants, RLE encoding, etc., can be optimized and their code books trained for input having certain characteristics such as high spectral values, low spectral values, mixed or alternating spectral values, or some other desired/probable feature. In contrast with prior use of a single encoder for all input, illustrated configurations match different encoding methods according to a best match between a statistical profile for an input and the statistical profile for data on which an encoder code book was trained.

After determining which encoder 402–406 to use, processing continues as discussed with respect FIG. 2 for transmitting data to a receiver 216 for decoding. Note that an inverse mode selector is not shown. A decoder selector is necessary (e.g., as part of the FIG. 2 decoder 212) to properly select an appropriate decoder to reverse the work of the mode selector 400. However, as discussed above, range divider locations can be determined in advance, thus leaving their identification implied during decoding. Or, for dynamic adaptive encoding/decoding, embedded flags may be used to trigger decoder selection. Using flags is equivalent to using a mode selector, and the mode selector can be designed to operate for both pre-determined and adaptively located partitions.

FIG. 5 illustrates a threshold grid that can be used to modify creation of an entropy code book. The upper left corner represents highest values, and the lower right corner represents lowest values. As discussed for FIGS. 3 and 4, encoding becomes more efficient when encoders can be tailored to process certain portions of the input data. In particular, when it is known that the encoding method will produce a significant number of repeating frequency coefficients, an entropy coder can be combined with RLE-type encoding to increase coding efficiency for data containing the repeated value.

In the illustrated embodiments, quantization of the input data introduces zero or near-zero spectral coefficients for significant portions of the frequency ranges for the input data. Consequently, rather than applying the same entropy coder used for the mostly non-zero data (e.g., the encoder and code book of FIG. 5), instead a RLE-based entropy coder is used. To do so, a special entropy code book is constructed (see FIG. 6). Although it is assumed that RLE compressible data is mostly runs of zero spectral coefficients, note that the disclosed methods are applicable to any repeating data values.

The left edge $R_j$ 502 of the grid 500 represents zero value runs $R_j$ in the input stream having length at or exceeding j, where j ranges from a length of a zero length run to an m-length run. The value of m is a known maximum length zero-value run based on analysis of exemplary input, or from dynamic inspection of incoming data. The top edge of the grid represents spectral coefficient values $L_i$ having intensity at or exceeding i, where i ranges from a minimum intensity of zero, up to a maximum intensity n. As with determining the maximum value m, n is determined according to exemplary input or currently received input.

The grid pictorially presents computation of the probability of receiving a run of zero (or other predetermined) value coefficients R having length of at least j that is followed by a spectral intensity value of i in intensity. The darker squares, e.g., 504, 506, correspond to event pairings ($R_j,L_i$) having higher probability, and are collectively referenced as region 508. The lighter squares, e.g., 510, 512, 514, represent pairings having low probability, such as long zero runs followed by high spectral coefficients, and are collectively referenced as region 516. The graph shows that short zero-value runs followed by low spectral values are the most likely input sequences to be received, and that as run lengths get longer, or spectral values get higher, the probability of such combination is reduced.

During entropy code book construction, the improbable pairings are excluded from the code book. Exclusion is made with respect to a selected probability threshold 518. Event pairings below the threshold are deemed insufficiently probable and are excluded from the code book. The result of the exclusion is to limit code book size, while also allowing very efficient encoding of probable input sequences having sequences of zero values.

Figure 6:
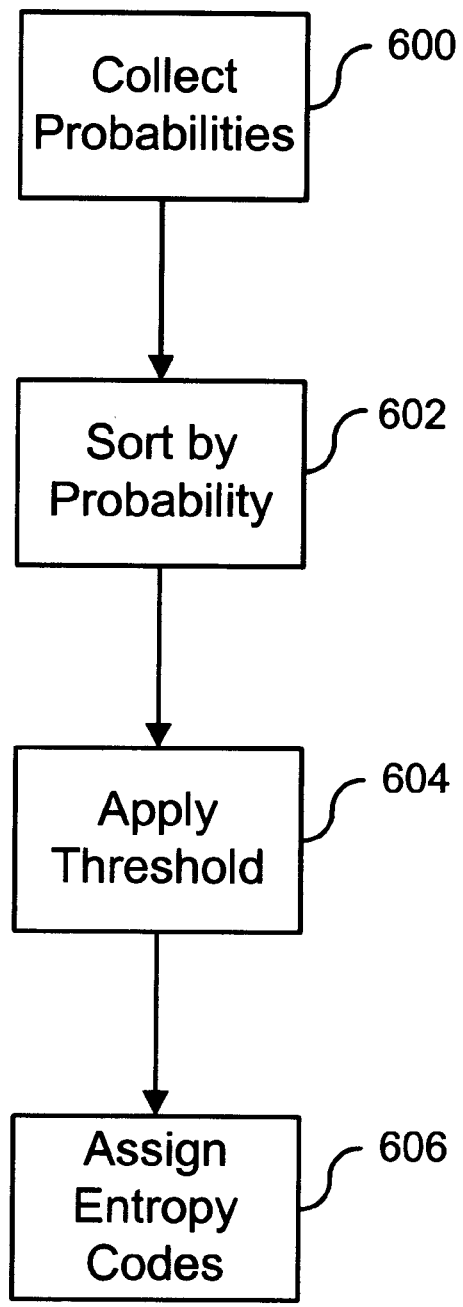
FIG. 6 illustrates code book creation in accordance with a FIG. 5 threshold grid.

FIG. 6 illustrates constructing an entropy code book in accordance with a FIG. 5 spectral threshold grid. As a more formal description of the contents of FIG. 5, let the absolute values of non-zero spectral samples form an integer set $L_i=\{1, 2, 3, \ldots, L_n\}$ where $L_n$ stands for any value that is greater than or equal to $L_n$ (corresponding to the FIG. 5 top grid edge). Let the run length of zero spectral samples in an input stream form another set $R_j=\{1, 2, 3, \ldots, R_m\}$ where $R_m$ stands for any zero runs with length equal to or longer than $R_m$ (corresponding to the FIG. 5 left grid edge). Using this notation, we can represent an input of frequency coefficients with a string of input symbols defined as ($R_j$, $L_i$), which corresponds to $R_j$ zero spectral samples followed by a non-zero spectral sample having intensity of at least $L_i$.

This method defines entropy codes with respect to the probability of receiving certain zero run lengths along with non-zero input contrasts prior art methods, and therefore performs an RLE-type of encoding as input sequences assigned codes include runs of repeating symbols (e.g., the zero value symbols). To create a code book for the illustrated embodiment, a preliminary step is to collect the probability of occurrence 600 for each possible pairing. The computed probabilities can then be sorted 602, and a probability threshold 518 (FIG. 5) applied 604. Application of the threshold operates to exclude all input pairings in FIG. 5 grid region 516. Entropy codes are then assigned 606 to remaining pairings in FIG. 5 region 508.

There are various techniques available for storing and manipulating the code book. For example, one structure is storing the two-dimensional grid in permanent storage, where data retrieval is performed by identifying two indices. Thus, one can retrieve table entries by specification of a run-length and a particular symbol value. A decoding table can be implemented as a Huffman tree. Another code book implementation includes Rice-Golomb structures, and their equivalents.

Figure 7:
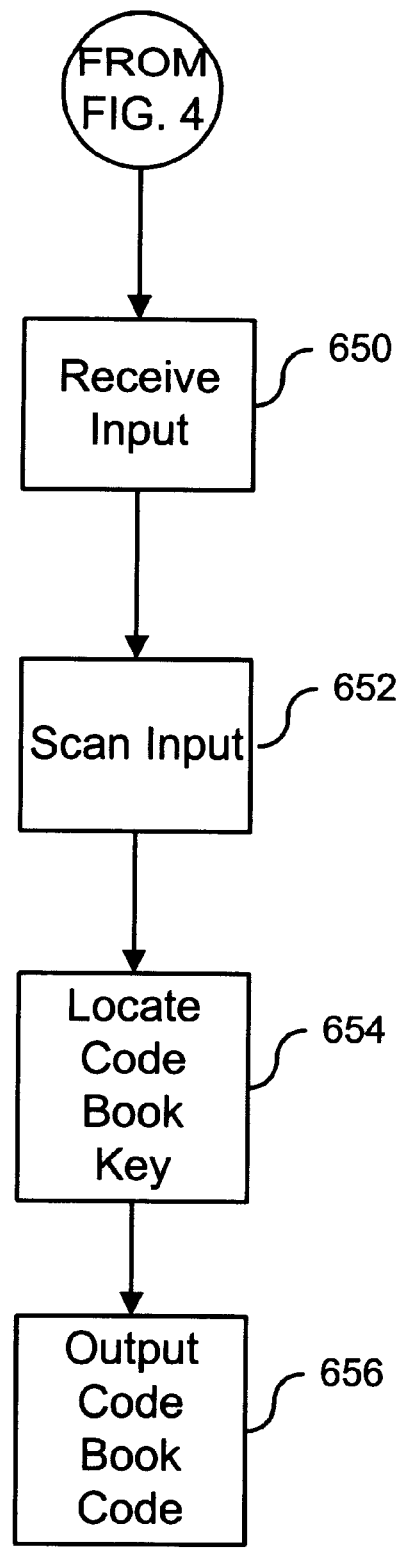
FIG. 7 is a flowchart for encoding (or decoding) audio data with the FIG. 6 code book.

FIG. 7 shows one method for encoding data with RLE-based entropy encoder of FIGS. 5 and 6. It is assumed that encoding has proceeded as illustrated in FIG. 4, until mode selector 400 determines that RLE encoding is required. As illustrated, a series of spectral coefficients are received 650. This input is scanned 652 to identify an input sequence having zero value spectral samples followed by a non-zero spectral sample. This sequence is then looked up 654 in the code book of FIG. 6, and the corresponding code is output 656.

If the particular scanned sequence 652 is not found within the code book, then it is known to have originally belonged to the low probability region 516 of FIG. 5. A special output symbol can be inserted into the output data stream to identify this data configuration, along with sufficient information to identify the received event (e.g., a code to identify the number of zero valued samples, followed by the non-zero sample). In the case of an input spectrum ending with N zeros, either a special ending signal is needed or a special event such as (N, 1) suffices because the decoder is aware the total number of samples and able to stop decoding when that limit is exceeded.

Although not explicitly illustrated, decoding operates as an inverse operation of encoding, where the encoded data 656 is looked up 654 in a corresponding FIG. 5 decoding code book, in order to recover the input sequence 652.

Having described and illustrated the principles of my invention with reference to an illustrated embodiment, it will be recognized that the illustrated embodiment can be modified in arrangement and detail without departing from such principles. Accordingly, we claim as the invention all such modifications as may come within the scope and spirit of the following claims and equivalents thereto.

What is claimed is:

1. A method of encoding audio data frequency coefficients, the method comprising:
   receiving a sequence of audio data frequency coefficient symbols, wherein the sequence includes a run and an adjacent symbol, the run including R symbols each having a first value, and the adjacent symbol having a value L other than the first value;
   looking up the sequence within a data structure that assigns a corresponding entropy code to the sequence based jointly upon the values for R and L for the sequence; and
   outputting the corresponding entropy code for the sequence.

2. A method according to claim 1, wherein the first value is zero, and L is non-zero.

3. A computer readable medium having encoded thereon instructions for directing a computer to perform the method of claim 1.

4. The method of claim 1 wherein the corresponding entropy code for the sequence is an escape code.

5. A method of decoding entropy encoded audio data frequency coefficients, comprising:
   receiving an entropy code representing a sequence of audio data frequency coefficient symbols;
   looking up the entropy code within a data structure that assigns a corresponding sequence of symbols to the entropy code, wherein the corresponding sequence includes a run of symbols having a first value, the run repeating for R symbols, and wherein the corresponding sequence further includes an adjacent symbol having a value L other than the first value; and
   outputting the sequence of audio data frequency coefficient symbols corresponding to the entropy code.

6. A method according to claim 5 further comprising:
   determining whether the entropy code is an escape code; and
   when the entropy code is an escape code, identifying an escape code event sequence of audio data frequency coefficient symbols, and outputting such escape code event sequence.

7. A computer readable medium having encoded thereon instructions for directing a computer to perform the method of claim 6.

8. A method of creating an entropy code book for encoding audio data frequency coefficient symbols with an entropy encoder, the method comprising:
   creating a data structure containing a plurality of pairings for input sequences of audio data frequency coefficient symbols, where each pairing jointly represents a repeating run of symbols having a first value and an adjacent symbol having a value L other than the first value, where the length of the repeating run is R;
   determining a probability of occurrence of each pairing; and
   assigning an entropy code to each pairing according to its probability of occurrence.

9. The method of claim 8, further comprising:
   setting a probability threshold;
   wherein each pairing having a probability of occurrence below the probability threshold is assigned an escape code.

10. A method according to claim 8, wherein R represents a length value for a run of zero value audio frequency coefficient symbols.

11. A computer readable medium having encoded thereon instructions for directing a computer to perform the method of claim 8.

12. A system for encoding audio data frequency coefficients, the system comprising:
   means for receiving a sequence of audio data frequency coefficient symbols, wherein the sequence includes a run and an adjacent non-zero coefficient symbol, the run repeating for R zero coefficient symbols;
   means for looking up the sequence within a data structure that assigns a corresponding entropy code to the sequence based jointly upon the values for R and L for the sequence;
   means for outputting the corresponding entropy code for the sequence.

13. A system according to claim 12, further comprising:
   a signal transformer for converting a time-domain input signal to a frequency-domain audio sequence; and
   a quantizer for quantizing the frequency-domain audio sequence into the sequence of audio data frequency coefficient symbols.

14. A system for decoding entropy encoded audio data frequency coefficients, comprising:
   means for receiving an entropy code representing a sequence of audio data frequency coefficient symbols;
   means for looking up the entropy code within a data structure that assigns a corresponding sequence of coefficient symbols to the entropy code, wherein the corresponding sequence includes a run of zero coefficient symbols and an adjacent non-zero coefficient, the run repeating for R symbols; and
   means for outputting the corresponding sequence of audio data frequency coefficient symbols.

15. A system according to claim 14, in which the entropy encoded audio data frequency coefficients include entropy codes and escape codes followed by audio data frequency coefficient symbols adjacent each such escape code, the method comprising:

means for determining whether the received entropy code is an escape code;

means for identifying audio data frequency coefficient symbols adjacent such escape code; and means for outputting such symbols adjacent the escape code.

16. A computer-readable medium storing instructions for performing a method of encoding frequency coefficients for audio data, the method comprising:

receiving a set of frequency coefficients for audio data, the set including one or more sequences of coefficients, wherein for each sequence a pairing jointly represents a run length for the sequence and a non-zero value coefficient within the sequence, the run length indicating a run of zero value coefficients within the sequence;

for each of the one or more sequences,
assigning an entropy code based upon the pairing; and
outputting the entropy code.

17. The computer-readable medium of claim 16 wherein for an improbable sequence, the entropy code is an escape code, the method further comprising:

after outputting the escape code, outputting coefficients representative of the improbable sequence.

18. The computer-readable medium of claim 16 wherein for each of the one or more sequences, the run length is zero or more.

19. The computer-readable medium of claim 16 wherein for each of the one or more sequences, the non-zero value coefficient follows the run of zero value coefficients within the sequence.

20. A computer-readable medium storing instructions for performing a method of decoding entropy-coded frequency coefficients for audio data, the method comprising:

receiving one or more entropy codes for a set of frequency coefficients for audio data;

for each of the one or more entropy codes, assigning a sequence of coefficients to the entropy code, the sequence including a non-zero value coefficient and a run of zero value coefficients, wherein the run length of the run is zero or more; and outputting coefficients based upon the assigned sequences.

21. The computer-readable medium of claim 20 wherein for the sequence, the non-zero value coefficient follows the run of zero value coefficients.

* * * * *

UNITED STATES PATENT AND TRADEMARK OFFICE
CERTIFICATE OF CORRECTION

PATENT NO. : 6,223,162 B1
DATED : April 24, 2001
INVENTOR(S) : Wei-Ge Chen and Ming-Chieh Lee It is certified that error appears in the above-identified patent and that said Letters Patent is hereby corrected as shown below:

<u>Column 12,</u>
Lines 26-28, replace "wherein R represents a length value for a run of zero value audio frequency coefficient symbols" with -- wherein the first value is zero and L is non-zero --.

Signed and Sealed this

Third Day of December, 2002

JAMES E. ROGAN
*Director of the United States Patent and Trademark Office*